US012770535B2

(12) United States Patent
Kim et al.

(10) Patent No.: US 12,770,535 B2
(45) Date of Patent: Oct. 20, 2026

(54) DISPLAY DEVICE

(71) Applicant: LG ELECTRONICS INC., Seoul (KR)

(72) Inventors: Dohyeon Kim, Seoul (KR); Kitae Kang, Seoul (KR); Dongha Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 471 days.

(21) Appl. No.: 18/022,337

(22) PCT Filed: Aug. 27, 2021

(86) PCT No.: PCT/KR2021/011498
§ 371 (c)(1),
(2) Date: Feb. 21, 2023

(87) PCT Pub. No.: WO2022/045818
PCT Pub. Date: Mar. 3, 2022

(65) Prior Publication Data
US 2023/0328904 A1 Oct. 12, 2023

(30) Foreign Application Priority Data
Aug. 28, 2020 (KR) ........................ 10-2020-0109508

(51) Int. Cl.
*G09F 9/302* (2006.01)
*H05K 5/02* (2006.01)
*H05K 5/30* (2025.01)

(52) U.S. Cl.
CPC ......... *G09F 9/3026* (2013.01); *H05K 5/0217* (2013.01); *H05K 5/30* (2025.01)

(58) Field of Classification Search
CPC .......... G09F 9/3026; G09F 9/33; G09F 9/302; H05K 5/0217; H05K 5/30; F16B 2/10; F16B 5/0012; F16B 5/0084
See application file for complete search history.

(56) References Cited

U.S. PATENT DOCUMENTS 5,692,855 A * 12/1997 Burton .................. E02F 3/3668 37/906
6,508,494 B1 * 1/2003 Reuter ..................... H02B 1/38 292/25

(Continued)

FOREIGN PATENT DOCUMENTS

CN 206162329 U 5/2017
CN 109564743 A 4/2019

(Continued)

OTHER PUBLICATIONS

Liu Qingshan, "Illustrated Tutorial for Electric Bicycle Maintenance," Beijing: Mechanical Industry Press, 2nd edition, ISBN 978-7-111-52870-8, 2016, 15 pages total, with English Translation.

*Primary Examiner* — Imani N Hayman
*Assistant Examiner* — Theron S Milliser
(74) *Attorney, Agent, or Firm* — Birch, Stewart, Kolasch & Birch, LLP

(57) ABSTRACT

A display device includes: a lower frame; a plurality of lower guides moving along the lower frame in a horizontal direction; an upper frame spaced apart from the lower frame in a vertical direction; a plurality of upper guides moving along the upper frame in the horizontal direction; and a plurality of display modules disposed between the plurality of lower guides and the plurality of upper guides in the vertical direction and the horizontal direction. A lowermost display module among the plurality of display modules is
(Continued)

connected to the lower guide, and an uppermost display module among the plurality of display modules is connected to the upper guide.

17 Claims, 15 Drawing Sheets

(56) References Cited

U.S. PATENT DOCUMENTS

| | | | | |
|---|---|---|---|---|
| 6,926,375 | B2 * | 8/2005 | Nagamine | G09F 9/33 40/550 |
| 7,055,271 | B2 * | 6/2006 | Lutz | G09F 9/3026 40/605 |
| 7,864,516 | B2 * | 1/2011 | Lee | G09F 9/33 345/1.3 |
| 9,612,004 | B2 * | 4/2017 | Hemiller | H05K 7/14 |
| 9,972,229 | B2 * | 5/2018 | Hemiller | F21V 21/34 |
| 10,113,685 | B2 * | 10/2018 | Cho | F16M 11/22 |
| 10,290,240 | B2 * | 5/2019 | Kang | G09G 3/20 |
| 10,832,597 | B2 * | 11/2020 | Trachtenberg | G09F 9/3026 |
| 11,382,222 | B2 * | 7/2022 | Hao | H05K 5/30 |
| 11,922,833 | B2 * | 3/2024 | Gimbler | F16M 11/045 |
| 12,035,490 | B2 * | 7/2024 | Zhu | H05K 5/0204 |
| 2003/0217495 | A1 * | 11/2003 | Nagamine | H05K 5/30 40/605 |
| 2005/0081414 | A1 * | 4/2005 | Lutz | G09F 9/3026 40/564 |
| 2007/0000849 | A1 * | 1/2007 | Lutz | G09F 9/33 211/26 |
| 2009/0225506 | A1 * | 9/2009 | Lee | H05K 5/0204 29/469 |
| 2014/0003050 | A1 * | 1/2014 | Hemiller | H05K 7/14 362/249.01 |
| 2016/0210886 | A1 | 7/2016 | Brashnyk et al. | |
| 2016/0353594 | A1 * | 12/2016 | Cho | F16M 11/08 |
| 2017/0178549 | A1 * | 6/2017 | Hemiller | H05K 1/181 |
| 2017/0347466 | A1 * | 11/2017 | Kang | G09G 3/20 |
| 2019/0277377 | A1 | 9/2019 | Heo et al. | |
| 2019/0279540 | A1 * | 9/2019 | Trachtenberg | G09F 9/3026 |
| 2019/0289729 | A1 | 9/2019 | Nguyen et al. | |
| 2019/0307016 | A1 | 10/2019 | Kwon et al. | |
| 2020/0205305 | A1 | 6/2020 | Kim | |
| 2021/0004192 | A1 | 1/2021 | Kamiike | |
| 2021/0378111 | A1 * | 12/2021 | Hao | G09F 9/3026 |
| 2022/0093016 | A1 * | 3/2022 | Gimbler | F16M 11/126 |
| 2023/0171903 | A1 * | 6/2023 | Zhu | H05K 5/0204 361/807 |
| 2023/0328904 | A1 * | 10/2023 | Kim | F16B 5/0012 361/730 |

FOREIGN PATENT DOCUMENTS

| | | | |
|---|---|---|---|
| CN | 209168669 | U | 7/2019 |
| CN | 110246423 | A | 9/2019 |
| CN | 211351749 | U | 8/2020 |
| EP | 3 540 715 | A1 | 9/2019 |
| JP | 2008-180065 | A | 8/2008 |
| JP | 6695507 | B1 | 5/2020 |
| KR | 10-0755756 | B1 | 9/2007 |
| KR | 10-2009-0073764 | A | 7/2009 |
| KR | 10-0979709 | B1 | 9/2010 |
| KR | 10-2014-0035739 | A | 3/2014 |
| KR | 10-2015-0081228 | A | 7/2015 |
| KR | 10-1838639 | B1 | 3/2018 |
| KR | 10-2019-0108239 | A | 9/2019 |
| KR | 10-2020-0023151 | A | 3/2020 |
| KR | 10-2020-0076384 | A | 6/2020 |
| RU | 2 728 819 | C1 | 7/2020 |

* cited by examiner

【Fig. 1】
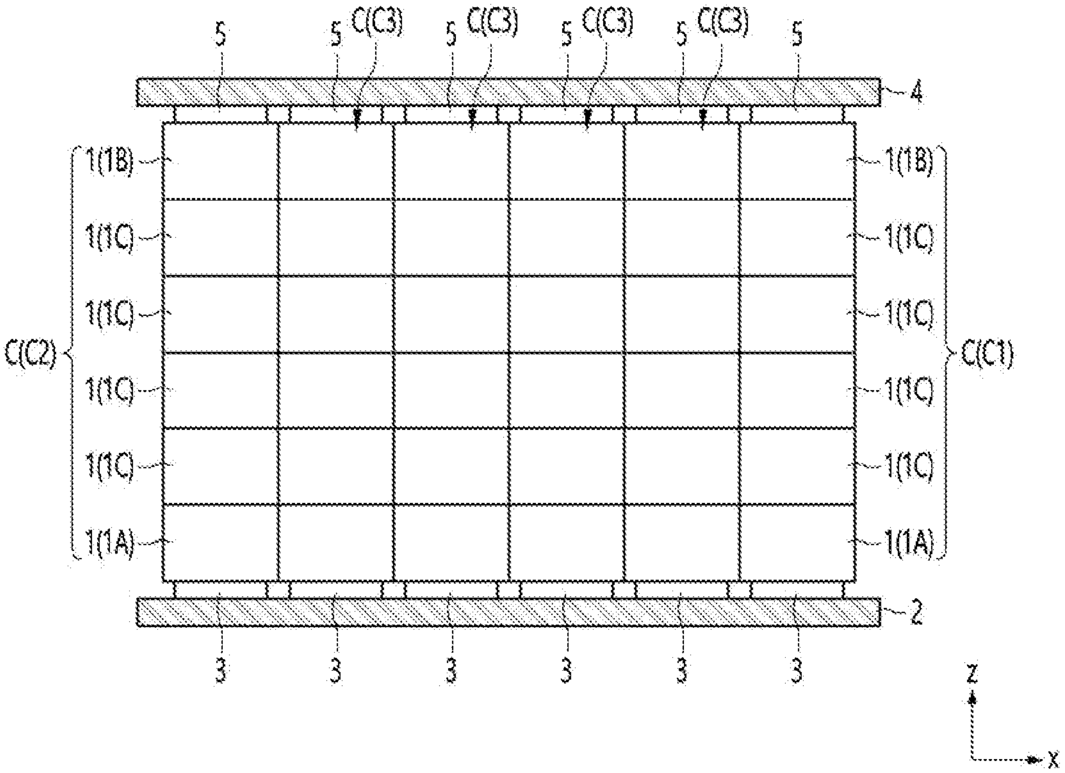

【Fig. 2】
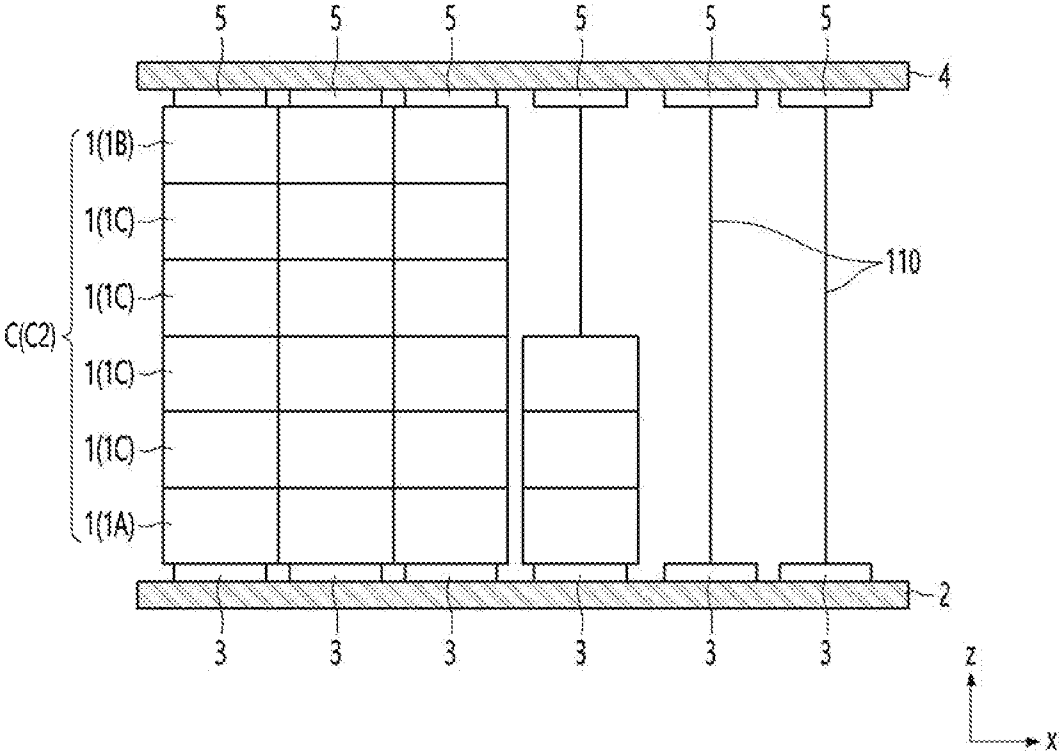
【Fig. 3】
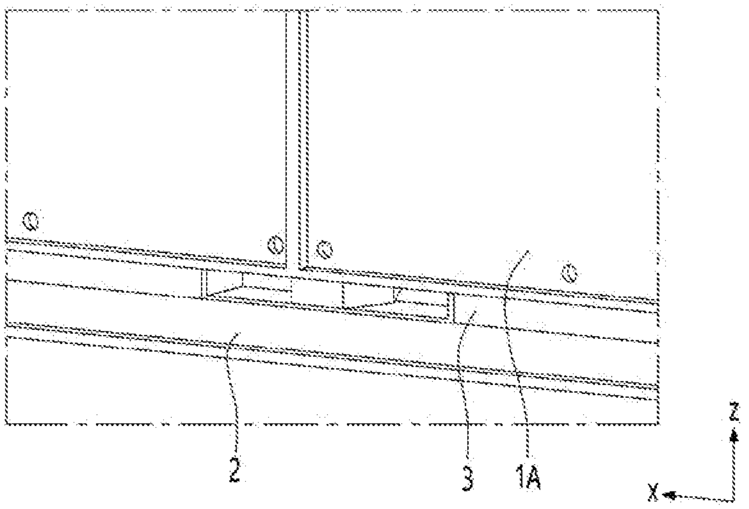

【Fig. 4】
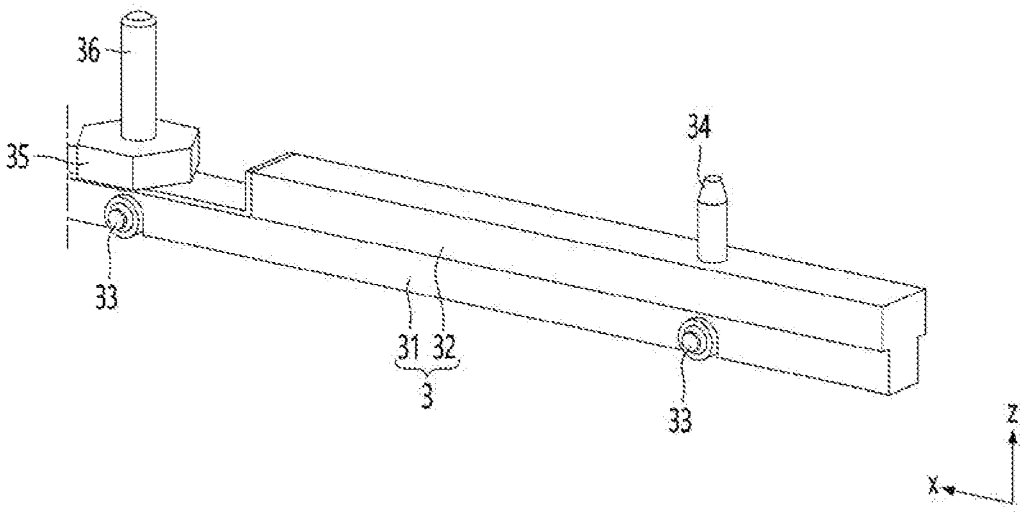
【Fig. 5】
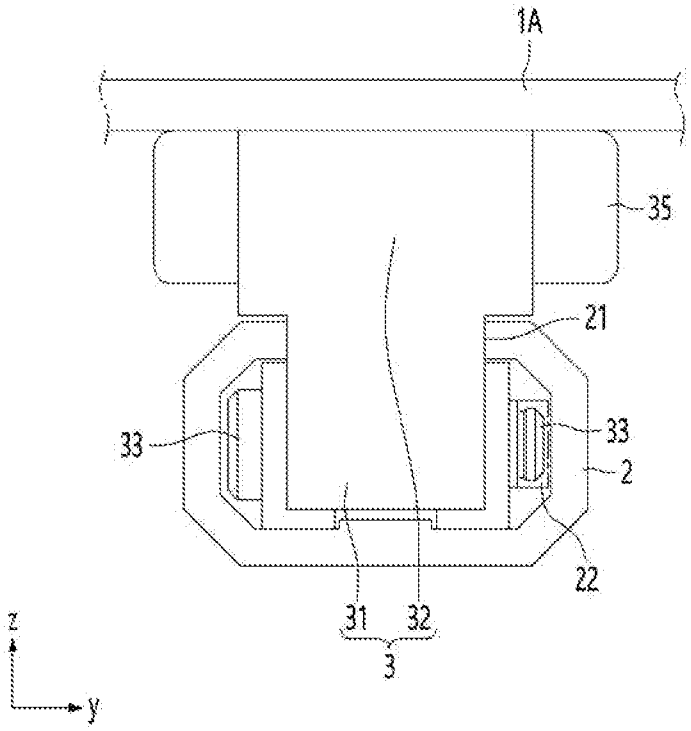

【Fig. 6】
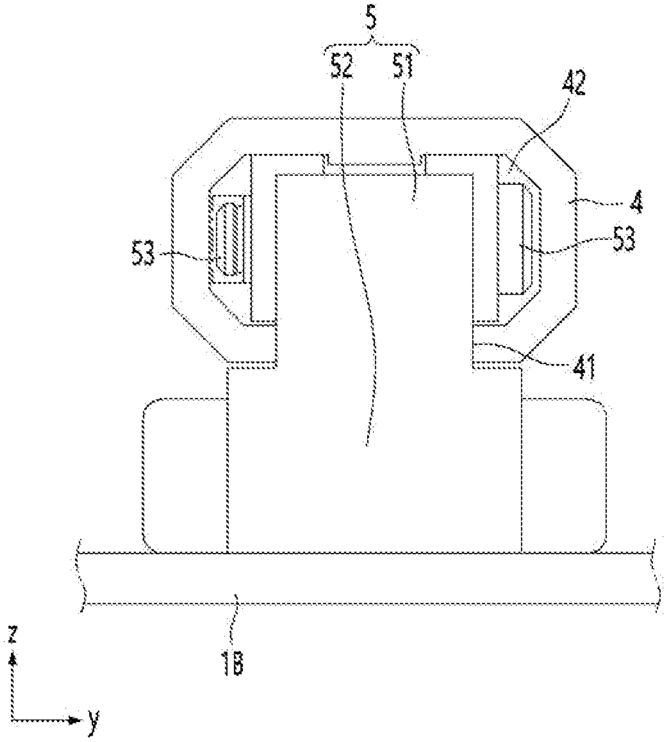

【Fig. 7】
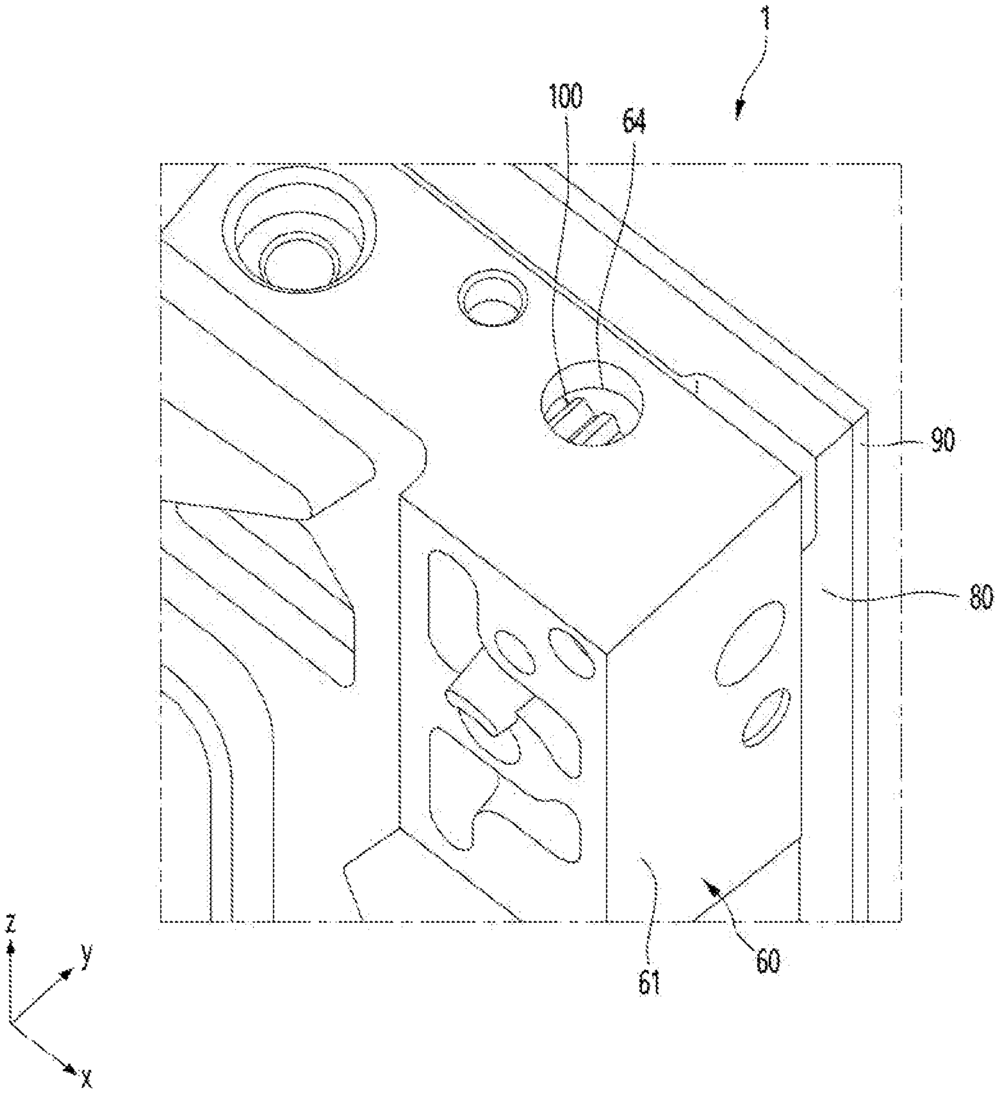

【Fig. 8】
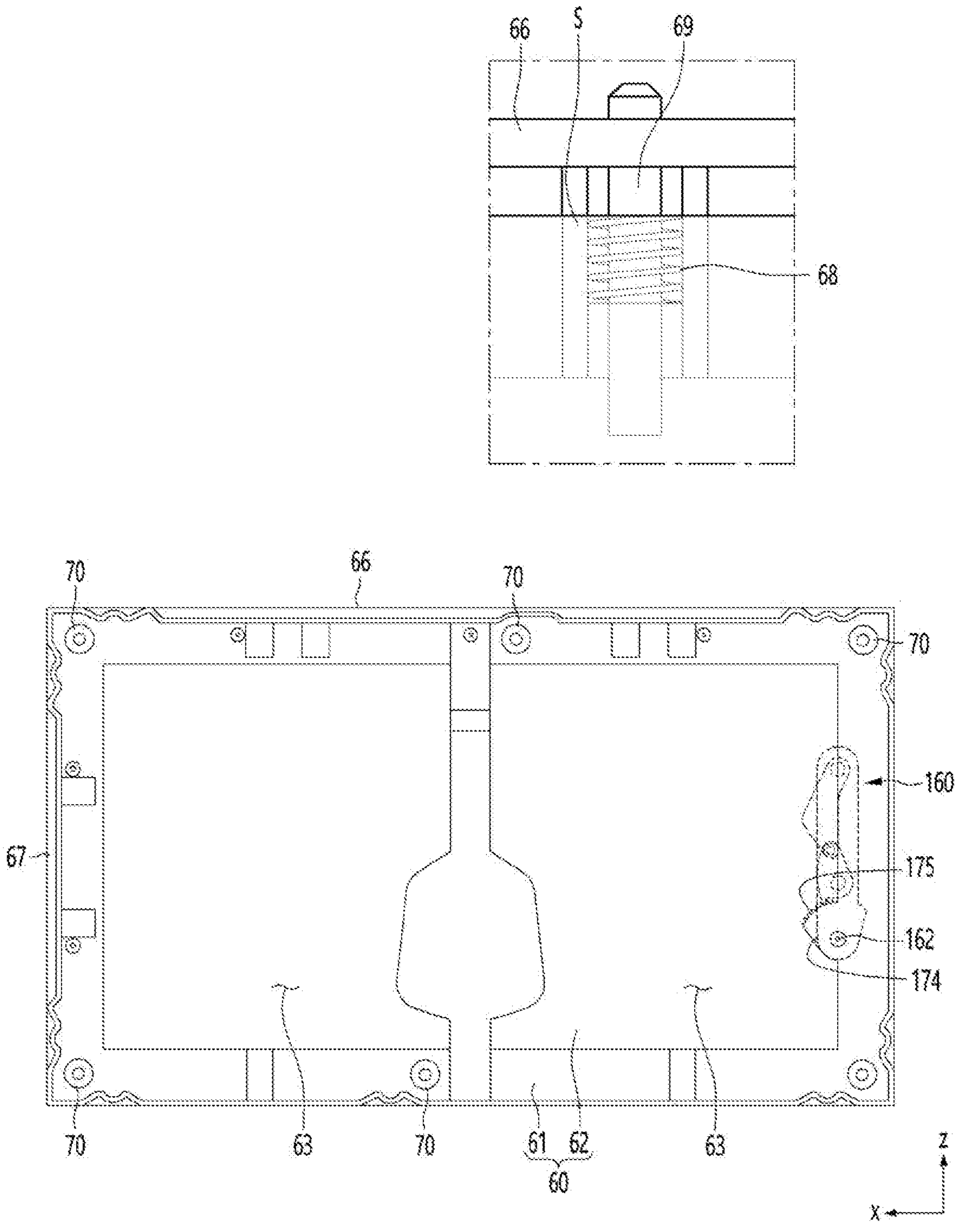

【Fig. 9】
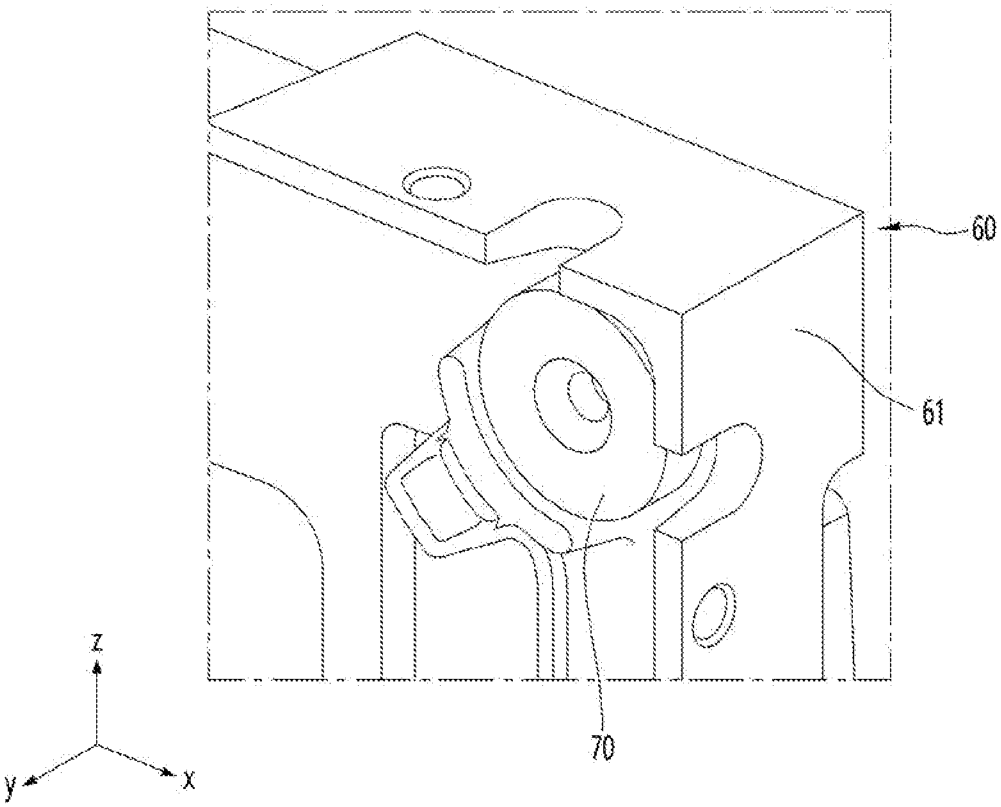
【Fig. 10】
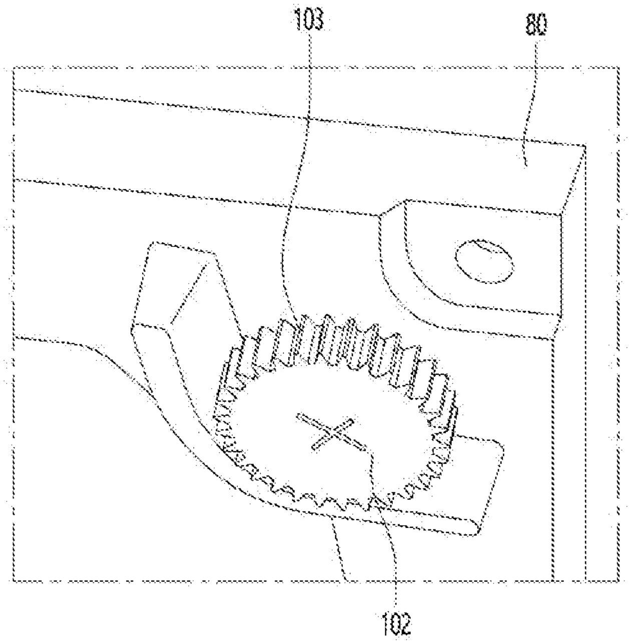

【Fig. 11】
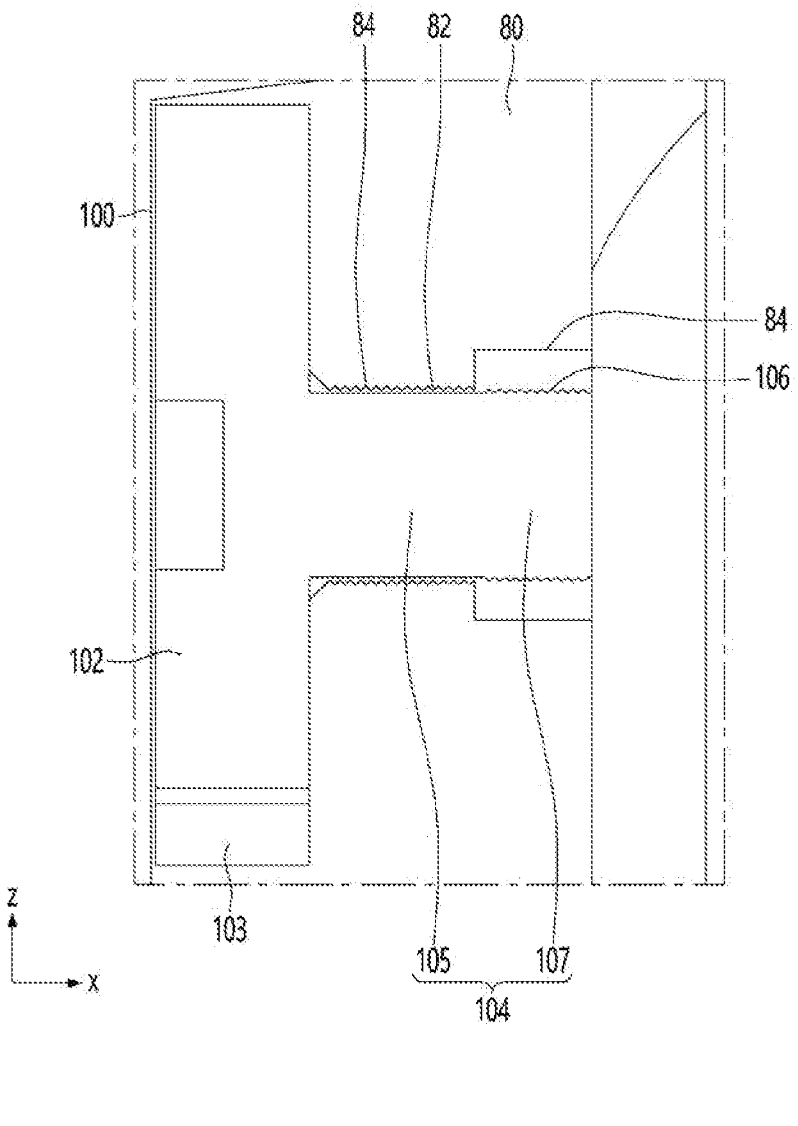

【Fig. 12】
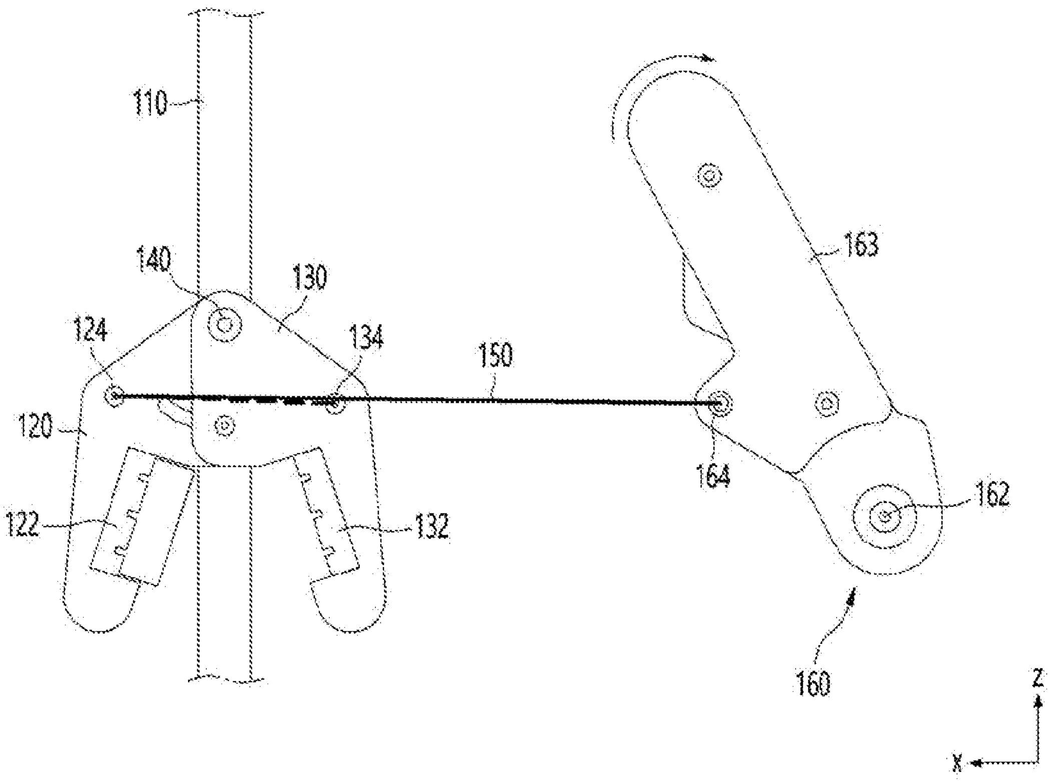

【Fig. 13】
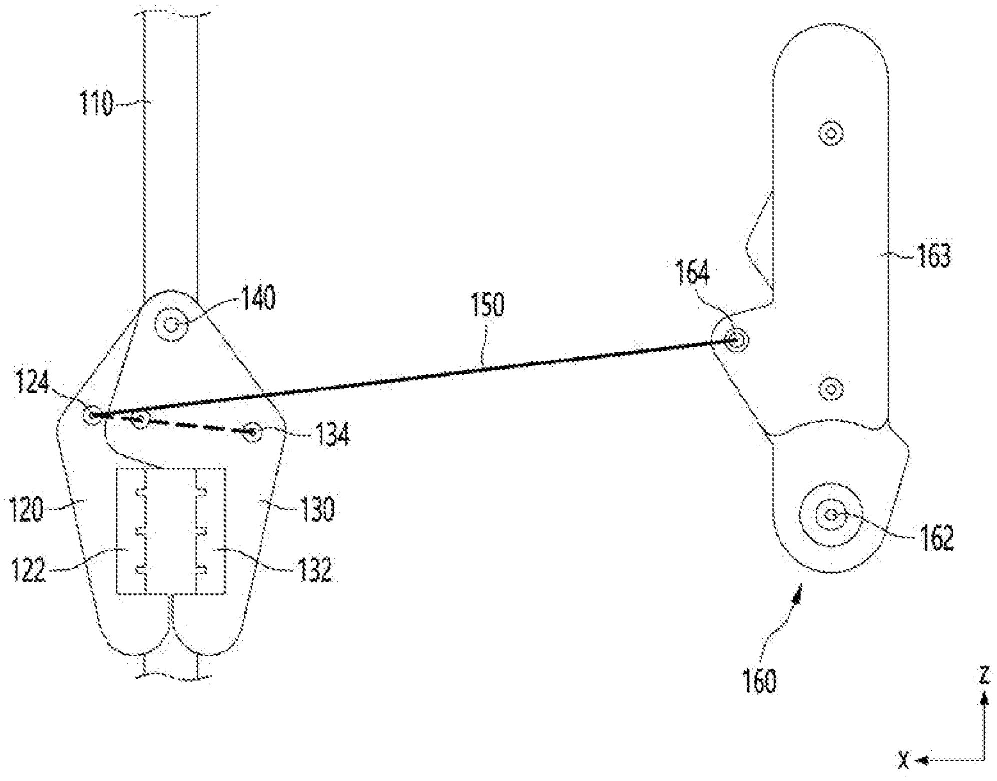

【Fig. 14】
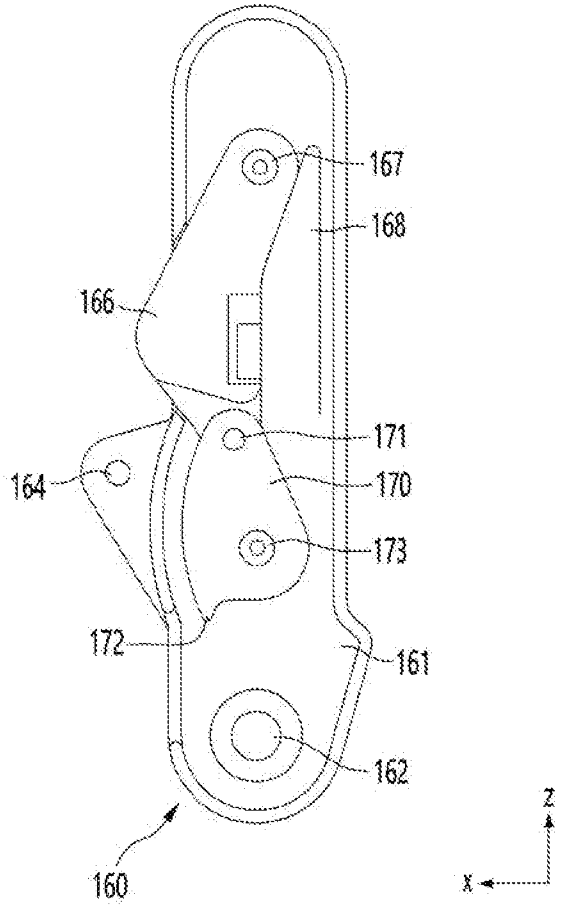

【Fig. 15】
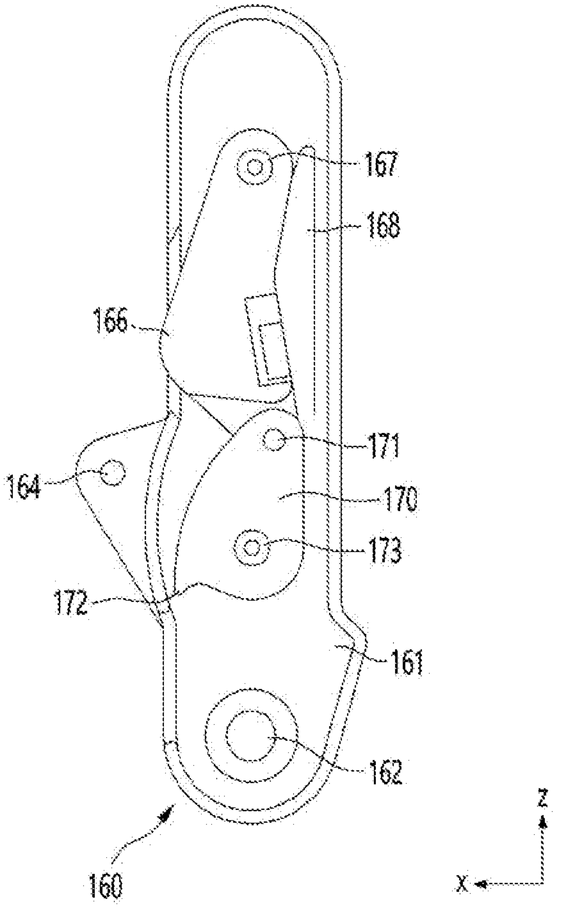

【Fig. 16】
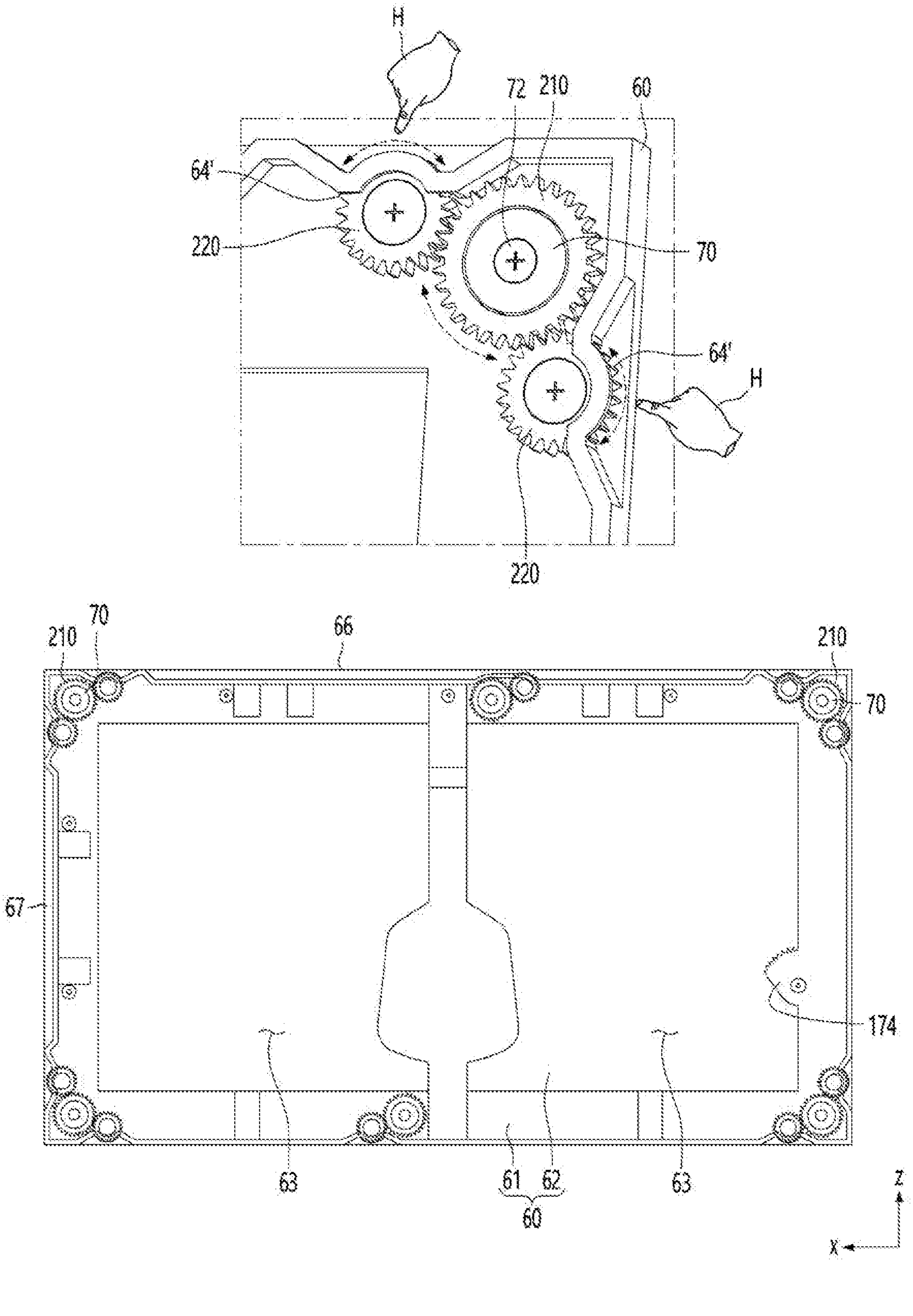

【Fig. 17】
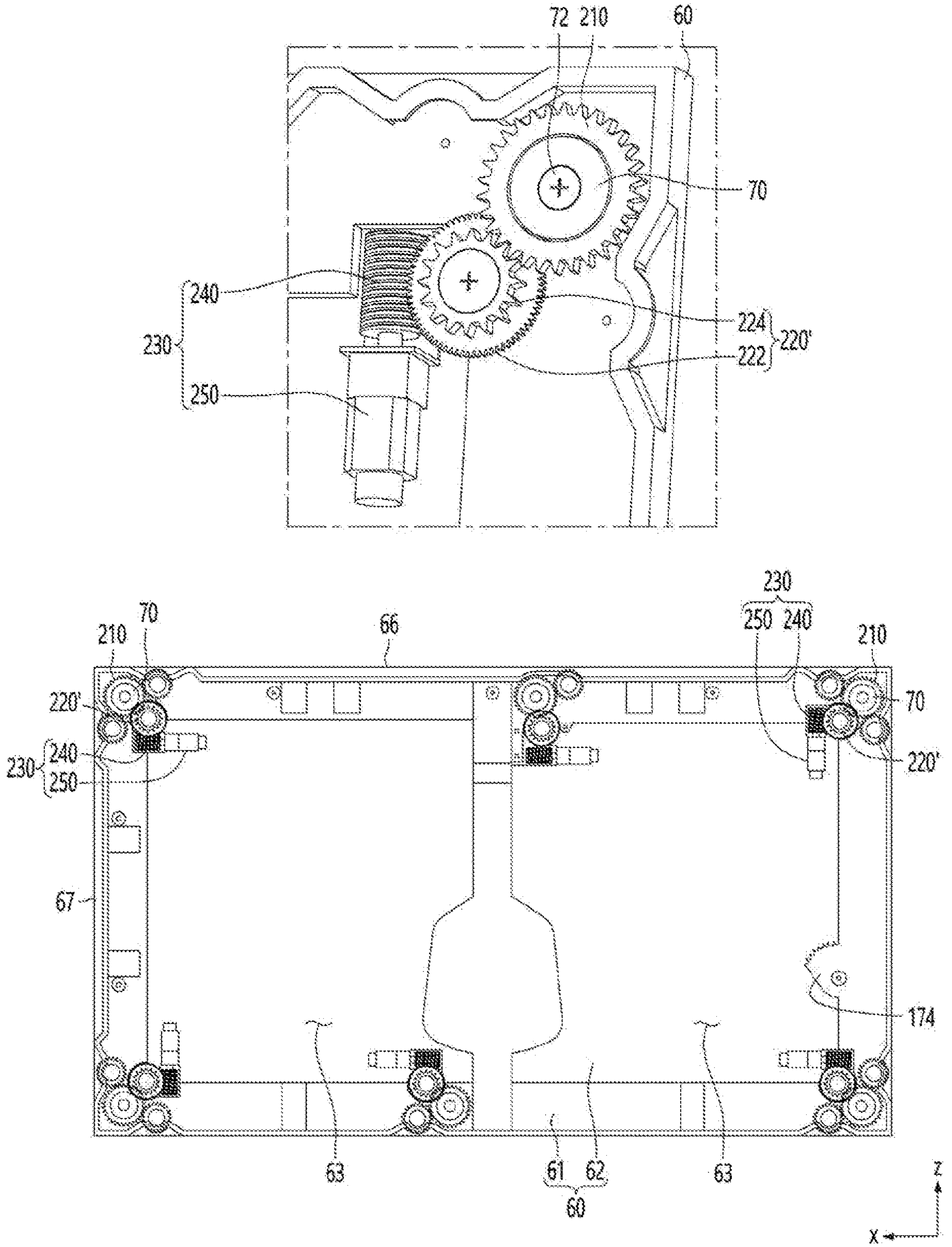

【Fig. 18】
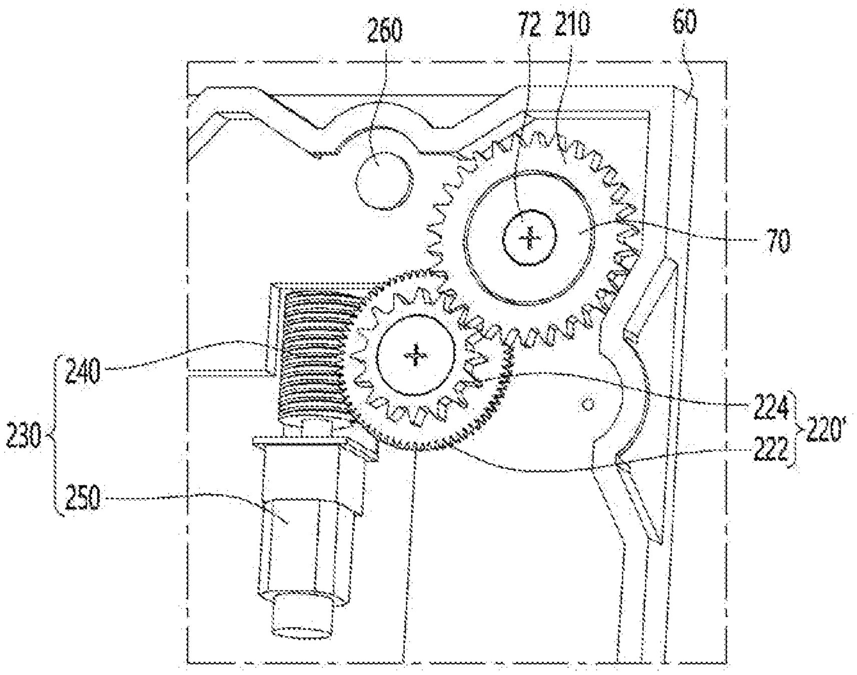

DISPLAY DEVICE

CROSS REFERENCE TO RELATED APPLICATIONS

This application is the National Phase of PCT International Application No. PCT/KR2021/011498, filed on Aug. 27, 2021, which claims priority under 35 U.S.C. § 119(a) to Patent Application No. 10-2020-0109508, filed in the Republic of Korea on Aug. 28, 2020, all of which are hereby expressly incorporated by reference into the present application.

TECHNICAL FIELD

The present disclosure relates to a display device.

BACKGROUND ART

In recent display devices, a plurality of display modules including a display panel are disposed together to form a large-sized screen.

A display device may implement a large-sized screen by combining a plurality of display panels.

As an example of a display device in which a plurality of display panels are disposed, Korean Patent Laid-Open No. 10-2016-0097599 A (published on Aug. 18, 2016) discloses a display module and a display device including the same. The display device includes a cabinet and a display module having a plurality of light emitting diode (LED) panels disposed in the cabinet. The cabinet includes a base plate on which the plurality of LED panels are mounted, a sidewall, a door coupled to the sidewall by a hinge, and a power terminal and a switch provided on the sidewall or a door. A signal control board for controlling the plurality of LED panels and a power supply for supplying power to the LED panels are disposed inside the cabinet, and the cabinet includes at least one connection device provided to be coupled to another display module.

In the display module, a rear cover of the cabinet is provided as a hinged door, thereby providing convenience during maintenance of the display device.

DISCLOSURE OF INVENTION

Technical Problem

An object of the present disclosure is to provide a display device with easy installation and service.

Another object of the present disclosure is to provide a display device capable of minimizing cracks in a display module.

Technical Solution

A display device of the present embodiment may include: a lower frame; a plurality of lower guides moving along the lower frame in a horizontal direction; an upper frame spaced apart from the lower frame in a vertical direction; a plurality of upper guides moving along the upper frame in the horizontal direction; and a plurality of display modules disposed between the plurality of lower guides and the plurality of upper guides in the vertical direction and the horizontal direction, wherein a lowermost display module among the plurality of display modules is connected to the lower guide, and wherein an uppermost display module among the plurality of display modules is connected to the upper guide.

The display device may further include: at least one lower roller disposed on the lower guide and rolling along the lower frame; and at least one upper roller disposed on the upper guide and rolling along the upper frame.

A fixing pin fixing the lowermost display module may be disposed in the lower guide.

The display device may further include: a supporter guide disposed on the lower guide in the vertical direction; and a supporter on which the lowermost display module is seated and which moves upward or downward along the supporter guide.

Each of the plurality of display modules may include: a cabinet; a magnet disposed on a front surface of the cabinet; a holder disposed in front of the cabinet; a display panel disposed on a front surface of the holder; and an adjusting screw screwed to the holder and magnetically detachable from the magnet.

The display module may further include: at least one wing movably disposed in the cabinet; and a spring disposed in the cabinet to elastically support the at least one wing.

The adjusting screw may include a head portion and a threaded portion protruding from the head portion.

The threaded portion may include a non-threaded area in which a male screw is not formed and a threaded area in which a male screw is formed.

The head portion, the non-threaded area, and the threaded area may be sequentially located in a longitudinal direction of the adjusting screw.

The holder may have a fastening hole formed with a female screw to which the male screw is screwed.

An accommodating hole accommodating the threaded area may be formed in the holder, and when the head portion is rotated, the male screw may be screwed to the female screw.

An adjusting hole opened toward the adjusting screw may be formed in at least one of the cabinet or the holder.

The display device may further include: a vertical rod; and a display module locker configured to lock to the vertical rod or unlock the display module from the vertical rod.

The display module locker may include: a friction member hinged to the vertical rod and having a friction portion capable of rubbing against the vertical rod; a wire connected to the friction member; and a control lever module rotatably disposed in the cabinet and connected to the wire.

The control lever module may include: a lever hinged to the cabinet and having a wire connection portion to which the wire is connected; and a lever locker configured to lock or unlock the lever.

The display module may include: a first gear screwed to the cabinet and coupled to the magnet; and a second gear engaged with the first gear.

The display module may further include a driving source configured to rotate the second gear, and the driving source may include a motor.

The display module may further include a distance sensor disposed in the cabinet, and the motor may be controlled when a value measured by the distance sensor is out of a set range.

Advantageous Effects

According to the present embodiment, a plurality of display panels stacked in a vertical direction may be moved in a horizontal direction, and may be assembled so that the gap between the display panel located on the left side and the display panel located on the right side is minimized.

In addition, since a lower guide and an upper guide are smoothly moved by a lower roller and an upper roller, a moving display panel does not suddenly strikes other displays and a worker may easily assemble the display panel.

In addition, since a fixing pin is fixed to the lowermost display module among the plurality of stacked display panels, the plurality of stacked display panels may be stably moved in the horizontal direction.

In addition, the plurality of display panels may be moved upward and downward together by moving a supporter upward and downward, and the supporter may be stably moved upward and downward by a supporter guide.

In addition, the gap between the cabinet and the holder may be adjusted by adjusting the fastening depth of an adjusting screw, and the level difference between the plurality of display panels may be easily adjusted.

In addition, when another adjacent display module strikes a wing, a spring may absorb impact, may induce the other adjacent display to gradually approach, and may minimize impact applied to the display module to protect the display panel.

In addition, since a male screw of the adjusting screw is not arbitrarily fastened to a female screw of a fastening hole, it is possible to minimize the arbitrary locking of the male screw into the female screw. When the adjusting screw is externally rotated, the male screw is fastened to the female screw, and thus, the amount of level difference between the plurality of display modules may be adjusted by using the adjusting screw.

In addition, since the plurality of display modules may be independently fixed, separation and service of some display modules may be facilitated.

In addition, since a magnet may move forward and backward in the cabinet, it is easy to adjust the gap between the cabinet and the holder and the level difference between the plurality of display modules may be easily adjusted.

BRIEF DESCRIPTION OF DRAWINGS

FIG. 1 is a front view of a display device according to the present embodiment.

FIG. 2 is a diagram illustrating a state in which the display device is being assembled, according to the present embodiment.

FIG. 3 is a diagram illustrating a part of a lower portion of the display device, according to the present embodiment.

FIG. 4 is a perspective view of a lower guide illustrated in FIG. 3.

FIG. 5 is a cross-sectional view illustrating a lower frame and the lower guide illustrated in FIG. 1.

FIG. 6 is a cross-sectional view illustrating an upper frame and an upper guide illustrated in FIG. 1.

FIG. 7 is a perspective view illustrating a display module according to the present embodiment.

FIG. 8 is a front view illustrating a cabinet according to the present embodiment.

FIG. 9 is a diagram illustrating the cabinet and a magnet according to the present embodiment.

FIG. 10 is a diagram illustrating a holder and an adjusting screw according to the present embodiment.

FIG. 11 is a cross-sectional view illustrating the holder and an adjusting screw according to the present embodiment.

FIG. 12 is a diagram illustrating a state when a display module locker unlocks the cabinet, according to the present embodiment.

FIG. 13 is a diagram illustrating a state when the display module locker locks the cabinet, according to the present embodiment.

FIG. 14 is a diagram illustrating a state in which a lever is locked, according to the present embodiment.

FIG. 15 is a diagram illustrating a state in which the lever is unlocked, according to the present embodiment.

FIG. 16 is a diagram illustrating a first modification of the present embodiment.

FIG. 17 is a diagram illustrating a second modification of the present embodiment.

FIG. 18 is a diagram illustrating a third modification of the present embodiment.

MODE FOR INVENTION

Hereinafter, detailed embodiments of the present disclosure will be described in detail with reference to the accompanying drawings.

FIG. 1 is a front view of a display device according to the present embodiment, and FIG. 2 is a diagram illustrating a state in which the display device is being assembled, according to the present embodiment.

The display device may include a plurality of display modules 1 disposed in a vertical direction Z and a horizontal direction X.

The plurality of display modules 1 may be stacked in the vertical direction Z, and the plurality of display modules 1 stacked in the vertical direction Z may be defined as one column C. The plurality of display modules 1 constituting one column C may include a lowermost display module 1A, an uppermost display module 1B, and at least one middle display module 1C. The at least one middle display module 1C may be stacked between the lowermost display module 1A and the lowermost display module 1B in the vertical direction Z.

In the display device, a plurality of columns C may be disposed in the horizontal direction X. The display device may include a left column C1 located at the leftmost side, a right column C2 located at the rightmost side, and at least one middle column C3 disposed between the left column C1 and the right column C2.

For example, when the display device includes six columns C and one column C includes six display modules 1, the display device may include a total of 36 display modules 1.

The display device may include a lower frame 2, a plurality of lower guides 3, an upper frame 4, and a plurality of upper guides 5, and the plurality of display modules 1 may be disposed between the plurality of lower guides 3 and the plurality of upper guides 5.

In the display device, the plurality of display modules 1 may be stacked for each column C. The respective columns C may be conveyed between the lower frame 2 and the upper frame 4 in the horizontal direction X, so that the respective columns C may be brought into close contact with each other.

The display device may further include vertical rods (see 110 of FIG. 2). The plurality of display panels 1 may be independently fixed and locked to the vertical rods 110.

For example, the vertical rod 110 may be disposed between the lower frame 2 and the upper frame 4 in the vertical direction Z. The lower portion of the vertical rod 110 may be connected to the lower frame 2, and the upper portion of the vertical rod 110 may be connected to the upper frame 4.

As another example, the vertical rod 110 may be disposed between the lower guide 3 and the upper guide 5 in the vertical direction Z. The lower portion of the vertical rod 110 may be connected to the lower guide 3, and the upper portion of the vertical rod 110 may be connected to the upper guide 5.

The vertical rod 110 may be fixedly disposed and may also be disposed to be movable in the vertical direction Z.

When the vertical rod 110 moves upward, a lead screw (not illustrated) for moving the vertical rod 110 upward and downward may be connected to the upper or lower portion of the vertical rod 110.

FIG. 3 is a diagram illustrating a part of the lower portion of the display device, according to the present embodiment, FIG. 4 is a perspective view of the lower guide illustrated in FIG. 3, FIG. 5 is a cross-sectional view illustrating the lower frame and the lower guide illustrated in FIG. 1, and FIG. 6 is a cross-sectional view illustrating the upper frame and the upper guide illustrated in FIG. 1.

The display device may apply a conveying device of a roller structure to the loafer frame 2 and the upper frame 4.

The lower frame 2 may be disposed on the wall surface or the like in the horizontal direction X. An opening 21 may be formed in the upper surface of the lower frame 2 and a space 22 may be formed therein.

As illustrated in FIG. 5, the lower guide 3 may include an insertion portion 31 inserted into the space 22 of the lower frame 2 through the opening 21 of the lower frame 2, and a non-insertion portion 32 that protrudes from the insertion portion 31 and may be caught by the lower frame 2 in the vertical direction Z.

At least one lower roller 33 rotatably mounted on the insertion portion 31 may be disposed in the lower guide 3. The lower roller 33 may roll along the lower frame 2 inside the lower frame 2.

A plurality of lower rollers 33 may be provided in the lower guide 3, and the plurality of lower rollers 33 may be spaced apart from each other in the front-and-rear direction Y and the horizontal direction X.

The lower roller 33 may constitute a lower sliding conveying device together with the lower guide 3.

The lowermost display module 1A may be connected to the lower guide 3. A fixing pin 34 capable of fixing the lowermost display module 1A may be disposed in the lower guide 3. The fixing pin 34 may be inserted into an insertion groove (not illustrated) formed in the lower portion of the lowermost display module 1A to restrict arbitrary deviation of the lowermost display module 1A in the horizontal direction or the front-and-rear direction.

A supporter 35 capable of determining the height of the lowermost display module 1A may be disposed on the lower guide 3.

A supporter guide 36 capable of guiding the supporter 35 may be disposed on the lower guide 3. The supporter guide 36 may be disposed on the lower guide 3 in the vertical direction Z. The supporter guide 36 may protrude upward from the lower guide 3.

A female screw may be formed on the inner circumferential surface of the supporter 35, and an engageable male screw may be formed on the outer circumferential surface of the supporter guide 36. When the supporter 35 rotates, the supporter 35 may move upward or downward while rotating along the supporter guide 34.

The outer circumferential surface of the supporter 35 may be formed in an angular shape, and a worker may easily rotate the supporter 35 by using a tool outside the display device.

The lowermost display module 1A may be seated on the supporter 35. When the height of the supporter 35 is high, the height of the lowermost display module 1A may be high, and when the height of the supporter 35 is low, the height of the lowest display module 1A may be low.

The supporter 35 may be a lifter or a lift-up device that moves the column C upward, or a carrier that is capable of carrying the column C upward.

A groove portion with an opened upper surface may be formed at one side of the lower guide 3, the supporter guide 36 may be disposed to protrude upward from the groove portion, and the supporter 35 may rotate within the groove portion.

A separate protection member may be disposed in the groove portion of the lower guide 3 along the shape of the groove portion, and the supporter 35 may be disposed inside the protection member.

The lower guide 3 may correspond to the column C one to one. One lower guide 3 may support one column C. The number of lower guides 3 may be the same as the number of columns C.

The plurality of lower guides 3 may move along the lower frame 2 in the horizontal direction X, and the upper column C of each of the lower guides 3 may move in the horizontal direction X together with the lower guide 3.

The upper frame 4 may be spaced apart from the lower frame 2 in the vertical direction Z. The upper frame 4 may be disposed above the lower frame 2 and may be parallel to the lower frame 2. The upper frame 4 may be disposed to be vertically symmetrical with the lower frame 2.

The upper frame 4 may be disposed on the wall surface or the like in the horizontal direction X. An opening 41 may be formed in the lower surface of the upper frame 4 and a space 42 may be formed therein.

As illustrated in FIG. 6, the upper guide 5 may include an insertion portion 51 inserted into the space 42 of the upper frame 4 through the opening 41 of the upper frame 4, and a non-insertion portion 52 that protrudes from the insertion portion 51 and may be caught by the upper frame 4 in the vertical direction Z.

At least one upper roller 53 rotatably mounted on the insertion portion 41 may be disposed in the upper guide 5. The upper roller 53 may roll along the upper frame 4 inside the upper frame 4.

A plurality of upper rollers 53 may be provided in the upper guide 5, and the plurality of upper rollers 53 may be spaced apart from each other in the front-and-rear direction Y and the horizontal direction X.

The upper roller 53 may constitute an upper sliding conveying device together with the upper guide 5.

The uppermost display module 1B may be connected to the upper guide 5. An insertion groove capable of fixing the uppermost display module 1B may be formed in the upper guide 5.

A fixing pin protruding from the upper portion of the uppermost display module 1B may be inserted into and caught by the insertion groove, and may restrict arbitrary deviation of the uppermost display module 1B in the horizontal direction or the front-and-back direction.

The upper guide 5 may correspond to the column C one to one. One column C may be suspended by one upper guide 3. The number of upper guides 3 may be the same as the number of columns C.

The plurality of upper guides 5 may move along the upper frame 4 in the horizontal direction X, and the columns C below the upper guides 3 may move in the horizontal direction X along with the upper guides 3.

FIG. 7 is a perspective view illustrating a display module according to the present embodiment, FIG. 8 is a front view illustrating a cabinet according to the present embodiment, FIG. 9 is a diagram illustrating the cabinet and a magnet according to the present embodiment, FIG. 10 is a diagram illustrating a holder and an adjusting screw according to the present embodiment, and FIG. 11 is a cross-sectional view illustrating the holder and an adjusting screw according to the present embodiment.

A plurality of display modules 1 may each include a cabinet 60 a magnet (see 70 of FIG. 9) disposed on the front surface of the cabinet 60, a holder 80 disposed in front of the cabinet 60; a display panel 90 disposed on the front surface of the holder 80, and an adjusting screw (see 100 of FIGS. 10 and 11) screwed to the holder 80 and magnetically detachable from the magnet 70.

The cabinet 60 may form the circumferential appearance and the rear appearance of the display module 1. The cabinet 60 may be provided with a combination of a plurality of members. The cabinet 60 may form a space in which a control board (not illustrated) and a power supply (not illustrated) may be accommodated.

The cabinet 60 may include a frame 61 and a back cover 62.

The frame 61 may form the circumferential appearance of the display module 1. At least one through-hole (see 63 of FIG. 8) through which a cable (not illustrated) connecting the control board to the display panel 90 passes may be formed in the frame 61.

An adjusting hole (see 64 of FIG. 7) for adjusting the adjusting screw 100 may be formed in the frame 61. The adjusting hole 64 may be opened toward the adjusting screw 100. All or part of the adjusting hole 64 may face the adjusting screw 100.

A worker's finger or a tool such as a screwdriver may approach the adjusting screw 100 through the adjusting hole 64 and rotate the adjusting screw 100.

The worker may adjust the gap between the cabinet 60 and the holder 80 on the side, top, and bottom of the display panel 1 without disassembling the LED display module (LDM), and may adjust the level difference between the plurality of display panels 1.

At least one wing (see 66 and 67 of FIG. 8) may be disposed on the cabinet 60 so as to minimize impact applied by another adjacent display module 1.

The at least one wing may be disposed on frame 61. The wing may be a structure capable of preventing cracks of the display panel 90 due to collision.

A first wing 66 may be disposed on one of the upper and lower surfaces of the cabinet 60, and a second wing 67 may be disposed on one of the left and right surfaces of the cabinet 60.

When another display module 1 disposed above or below the cabinet 60 approaches the cabinet 60, the first wing 66 may absorb impact, and when another display module 1 disposed on the left or right side of the cabinet 60 approaches the cabinet 60, the second wing 67 may absorb impact.

The wings 66 and 67 may be movably disposed in the cabinet 60. The wings 66 and 67 may use repulsive force of a compression spring 68 to absorb impact, and may manage the gap with another adjacent display module 1.

The compression spring 68 may be supported to the cabinet 60 by a guide pin 69 provided on the cabinet 60, and may elastically support the wings 66 and 67.

The transfer of rapid movement of the wings 66 and 67 to the cabinet 60 may be minimized.

An accommodating space S in which the compression spring 68 and the guide pin 69 may be accommodated may be formed in the frame 61, and oil may be provided on the upper portion of the accommodation space S.

Oil may be provided together with the compression spring 68 and may absorb impact from the wings 66 and 67. An example of the oil may be silicone oil.

The wings 66 and 67 and the compression spring 68 described above may minimize the change in gap between the cabinet 60 and the holder 80 due to impact applied from the outside of the display module 1 to the display module 1.

The back cover 62 may form the rear appearance of the display module 1. The back cover 12 may be coupled to the rear surface of the frame 11 and may shield the through-hole 63.

The magnet 70 may constitute a holding mechanism together with the adjusting screw 50. The holding mechanism may hold the holder 80 in the cabinet 60.

As illustrated in FIGS. 8 and 9, the magnet 70 may be disposed on the frame 61, particularly the front surface of the frame 61. The magnet 70 may be fastened to the frame 61 with a fastening member such as a screw.

The magnet 70 may exert attractive force on the adjusting screw (see 50 of FIGS. 10 and 11) in a state of being fixed to the frame 61. When the adjusting screw 50 approaches a position where the attractive force of the magnet 70 can act, the adjusting screw 50 and the holder 80 may be pulled toward the cabinet 60 by the magnet 70.

As illustrated in FIG. 7, the holder 80 may support the display panel 90 at the rear of the display panel 90. The holder 80 and the display panel 90 may constitute an LDM. The LDM may cover a space formed in the cabinet 60 from the front.

The display panel 90 may include a plurality of display elements and a substrate on which the plurality of display elements are provided.

An example of the display element provided on the substrate may be an LED, specifically a micro LED. The display panel 90 may be a micro LED panel including a plurality of micro LEDs.

One LDM may include a plurality of display panels 90, and the plurality of display panels 90 may be disposed on the holder 80 in the vertical direction Z and the horizontal direction X. The plurality of display panels 90 may be disposed together on the front surface of the holder 80 and may be supported by the holder 80.

The adjusting screw 100 may be screwed to the holder 80 as illustrated in FIGS. 10 and 11. The adjusting screw 100 may be made of a material that adheres to the magnet 70. The adjusting screw 50 may be disposed on the holder 80. A portion of the adjusting screw 50 may be disposed to protrude rearward from the rear surface of the holder 80. The adjusting screw 50 may be fastened to the holder 80 so that the length (front-and-rear length) protruding from the rear of the holder 80 is variable.

The adjusting screw 100 and the magnet 70 may be a gap adjusting mechanism for adjusting the gap between the cabinet 60 and the LDM.

The worker or the display module 1 may adjust the position of the adjusting screw 100 in the front-and-rear direction Y or the position of the magnet 70. Due to adjustment, the gap between the cabinet 60 and the LDM may be changed.

As illustrated in FIG. 11, the adjusting screw 100 may include a head portion 102 and a threaded portion 104.

A rear male screw 103 may be formed on the outer circumference of the head portion 102. A worker's finger or a tool such as a screwdriver may contact the rear male screw 103 to rotate the head portion 102. When the head portion 102 rotates, the threaded portion 104 may be rotated and screwed to the holder 80.

The threaded portion 104 may be formed to protrude from the head portion 102. The threaded portion 104 may include an area (non-threaded area 105) where a male screw is not formed and an area (threaded area 107) where a male screw 106 is formed. Hereinafter, the area 105 where the male screw is not formed is referred to as the non-thread area 105, and the area where the male screw 106 are formed is referred to as the threaded area 107.

The non-threaded area 105 may be closer to the head portion 102 than the threaded area 107. The head portion 102, the non-threaded area 105, and the threaded area 107 may be sequentially positioned in the longitudinal direction of the adjusting screw 100. The non-threaded area 105 may extend to protrude from the head portion 102, and the threaded area 107 may extend from the non-threaded area 105 in the longitudinal direction of the adjusting screw 100.

On the other hand, a fastening hole 82 and an accommodating hole 84 may be formed in the holder 80.

A female screw 83 to which the male screw 106 of the adjusting screw 100 is screwed may be formed on the inner circumferential surface of the fastening hole 82.

The accommodating hole 84 may accommodate the threaded area 107.

When the male screw 106 is not screwed to the female screw 83, the threaded area 107 may be located within the accommodating hole 84, the threaded portion 104 may not be yet fastened to the fastening hole 82, and the adjusting screw 100 may be idle even if the head portion 102 is rotated.

In a state where the LDM is located in front of the cabinet 60 and the threaded area 107 is located in the accommodating hole 84, attractive force of the magnet 70 may act on the adjusting screw 100. In a state where attractive force of the magnet 70 acts on the adjusting screw 100, the worker may rotate the head portion 102. When the head portion 102 is rotated, the threaded area 107 enters the fastening hole 82 while the male screw 106 is screwed to the female screw 83, and the threaded area 107 is inserted into the fastening hole 82.

That is, the fastening hole 82, the accommodating hole 84, the non-threaded area 105 and the threaded area 107 are a screw locking prevention structure. The LDM may prevent the adjusting screw 100 from being locked in the holder 80 when the adjusting screw 100 is not close to the magnet 70. When external force is applied to the head portion 102, the threaded area 107 may be fastened to the holder 80.

Depending on the degree to which the worker rotates the head portion 102, the relative positions of the threaded area 107 and the holder 80 may be changed, and the worker may adjust the gap between the cabinet 60 and the holder 80 by a simple operation of rotating the head portion 102.

The distance between the cabinet 60 and the holder 80 may be different for each of the plurality of display modules 1. The front panel 90 of one of the plurality of display modules 1 may have a level difference from the front panel 90 of the other display module 1. It is preferable that the display device is installed such that the level difference is minimized.

The worker may minimize the level difference by a simple operation of rotating the head portion 102 of the adjusting screw 100.

FIG. 12 is a diagram illustrating a state when a display module locker unlocks the cabinet, according to the present embodiment, and FIG. 13 is a diagram illustrating a state when the display module locker locks the cabinet, according to the present embodiment.

The display device may include a display module locker that locks or unlocks the display module 1 to or from the vertical rod 110.

The display module locker may be provided for each display module 1, and the plurality of display modules 1 may be independently fixed to the vertical rods 110.

For example, when three middle display modules 1C among the plurality of middle display modules 1C are stacked, the first middle display module may be placed on the second middle display module, and the second middle display module may be placed on the third middle display module.

After the worker unlocks the display module locker of the first middle display module, the worker may position the first middle display module upward along the vertical rod 11, and may unlock the display module locker of the first middle display module. In this case, the lower end of the first middle display module may be spaced apart from the upper end of the second middle display module, and the first middle display module may be separated from the second middle display module.

After the worker unlocks the display module locker of the third middle display module, the worker may position the third middle display module downward along the vertical rod 11, and may unlock the display module locker of the third middle display module. In this case, the upper end of the third middle display module may be spaced apart from the lower end of the second middle display module, and the third middle display module may be separated from the second middle display module.

As described above, the second middle display module separated from the first middle display module and the third middle display module may be separated from the display device, and the worker may service the second middle display module without separating the entire display modules.

The plurality of display modules 1 may be individually lifted up by the display module rockers.

The display module locker may include a friction member rotatably connected to the vertical rod 110.

A pair of friction members may be provided on the vertical rod 110. The pair of friction members 120 and 130 may be provided to be bilaterally symmetrical with the vertical rod 110 with respect to the vertical rod 110.

The pair of friction members 120 and 130 may be hinged to the vertical rod 110 with the same first hinge shaft 140.

A first friction portion 122 that may rub against the vertical rod 110 may be provided on the first friction member 120 among the pair of friction members 120 and 130 so as to be spaced apart from the first hinge shaft 140, and a first wire through-hole 124 may be formed to be spaced apart from the first hinge shaft 140 and the first friction portion 122.

A second friction portion 132 that may rub against the vertical rod 110 may be provided on the second friction member 130 among the pair of friction members 120 and 130 so as to be spaced apart from the first hinge shaft 140, and a second wire through-hole 134 may be formed to be spaced apart from the first hinge shaft 140 and the second friction portion 132.

The display module locker may include a wire 150 connected to the pair of friction members 120 and 130.

The wire 150 may pass through the first wire through-hole 124 and then pass through the second wire through hole 134, and one end of the wire 150 may be connected to one of the pair of friction members 120 and 130.

The display module locker may include a control lever module 160 to which the other end of the wire 150 is connected.

The control lever module 160 may be rotatably connected to the cabinet (see 60 of FIG. 8) by a second hinge shaft 162.

The control lever module 160 may include a wire connection portion 164 which is spaced apart from the second hinge shaft 162 and to which the wire 150 is connected.

When the control lever module 160 is rotated (e.g., clockwise) about the second hinge shaft 162, as illustrated in FIG. 13, the wire 150 may be pulled by the control lever module 160, and the pair of friction members 120 and 130 may be rotated in a direction closer to each other by the wire 150. As illustrated in FIG. 13, each of the first friction portion 122 and the second friction portion 132 comes into contact with the vertical rod 110 and rubs against the vertical rod 110, and the display module 1 may be locked to the vertical rod 110.

On the other hand, when the user rotates the control lever module 160 in a direction opposite to the locking of the display module 1, as illustrated in FIG. 12, the wire 150 may be close to the friction members 120 and 130, and the pair of friction members 120 and 130 may rotate reversely in a direction away from each other. As illustrated in FIG. 12, each of the first friction portion 122 and the second friction portion 132 may be separated from the vertical rod 110, and the display module 1 may be unlocked from the vertical rod 110.

FIG. 14 is a diagram illustrating a state in which a lever is locked, according to the present embodiment, and FIG. 15 is a diagram illustrating a state in which the lever is unlocked, according to the present embodiment.

The control lever module 160 may be locked or unlocked.

The control lever module 160 may include a lever to which the second hinge shaft 162 is connected and in which the wire connection portion 164 is formed. The lever may be a handle held by a worker's hand when the worker changes the height of the display module 1.

The worker may manipulate the lever to adjust the pair of friction members 120 and 130 connected by the wire 150.

The lever may include a plurality of members. The lever may include a first lever 161 to which the second hinge shaft 162 is connected, and a second lever 163 coupled to the first lever 161.

The wire connection portion 164 may be formed at each of the first lever 161 and the second lever 163.

The first lever 161 and the second lever 163 may be coupled to each other and may rotate together about the second hinge shaft 162.

The control lever module 160 may include a control lever 166, a leaf spring 168, and a latch 170 disposed between the first lever 161 and the second lever 163.

The control lever 166, the leaf spring 168, and the latch 170 may constitute a lever locker that locks or unlocks the levers 162 and 164.

The control lever 166, the leaf spring 168, and the latch 170 may be located inside the levers 161 and 163.

The control lever 166 may be connected to at least one of the first lever 161 and the second lever 163 through a third hinge shaft 167.

The leaf spring 168 may be supported by at least one of the first lever 161 and the second lever 163 and may elastically support the control lever 166.

The latch 170 may be connected to the control lever 166 and a fourth hinge shaft 171, and a protrusion 172 spaced apart from the fourth hinge shaft 171 may protrude.

The latch 170 may rotate about a fifth hinge shaft 173 formed on at least one of the first lever 161 and the second lever 163.

As illustrated in FIG. 8, a latch locking member 174 may be disposed in the cabinet 60. A plurality of locking grooves 175 may be formed in the latch locking member 174. When the protrusion 171 is caught by one of the plurality of locking grooves 175, the protrusion 171 may be restrained by the latch locking member 174.

The protrusion 171 may be caught by or separated from the latch locking member 174 according to the angle at which the latch 170 is rotated.

As illustrated in FIG. 15, the user may rotate the control lever 166 about the third hinge shaft 167, and the control lever 166 may rotate the latch 170 while being elastically supported by the leaf spring 168. The protrusion 172 of the latch 170 may come out of the latch locking member 174. At this time, the control lever module 160 and the wire 150 are unlocked, and the user may rotate the control lever module 160.

On the other hand, when the user releases the control lever 166, the control lever 166 may be pushed by the leaf spring 168 and rotate reversely to reverse the latch 170. The protrusion 172 of the latch 170 may be rotated close to the latch locking member 174 and caught by one of the plurality of locking grooves 175. When the protrusion 172 of the latch 170 is restrained by the latch locking member 174, the control lever module 160 may be locked and the rotation thereof may be restrained.

FIG. 16 is a diagram illustrating a first modification of the present embodiment.

The first modification is to adjust a level difference by applying a gear structure. The level difference may be adjusted on the side, top, or bottom of the display module 1 without attaching or detaching the display panel 90 or the holder 80.

The first modification may include a first gear 210 screwed to the cabinet 60 and a second gear 220 rotatable manually. A fastening hole to which the first gear 210 is fastened may be formed in the cabinet 60.

The depth at which the first gear 210 is fastened to the cabinet 60 may be adjusted according to the rotation angle.

The first gear 210 may be coupled to the magnet 70. The magnet 70 may be coupled to the first gear 210 with a fastening member 72 such as a screw.

The first gear 210 may move the magnet 70 forward or backward according to the depth to which the first gear 210 is fastened. An example of the first gear 210 may be a level adjustment gear or a leveling spur gear that is threaded to the cabinet 60 so that the depth of fastening or the amount of level difference may be adjusted.

The second gear 220 may be engaged with the first gear 210 to rotate the first gear 210. An example of the second gear 220 may include an eyed spur gear.

The second gear 220 may be rotatably disposed in the cabinet 60. A fastening hole to which the second gear 220 is rotatably fastened may be formed in the cabinet 60.

The second gear 220 may be manually rotated by a worker's hand H or various tools, and the first gear 210 may move forward or backward with respect to the holder 90 by means of the threads. The level difference may be adjusted.

One second gear 220 may be positioned at each of a longitudinal position and a transverse position of the first gear 210, which are positions where adjustment is easy.

An adjusting hole 64' formed in the cabinet 60 may correspond to the second gear 220 one to one.

The adjusting hole 64' may be formed such that the second gear 220 is exposed to the outside, and a part of the second gear 220 may be located in the adjusting hole 64'.

In the first modification, in order to prevent locking of the first gear 210 or the second gear 220 at an initial position, a non-threaded area in which no male screw is formed and a threaded area in which a male screw is formed are formed together In the first gear 210 or the second gear 220, and the cabinet 60 may include a fastening hole formed with a female screw and an accommodating hole in which the threaded area is accommodated.

FIG. 17 is a diagram illustrating a second modification of the present embodiment.

In the second modification, the level difference may be remotely adjusted by using a motor located at the rear of the display panel 90 or the holder 80.

The second modification may include a first gear 210 screwed to the cabinet 60, a second gear 220' engaged with the first gear 210, and a driving source 230 for rotating the second gear 220'.

Since the first gear 210 is the same as the first gear 210 of the first modification, a detailed description thereof is omitted so as to avoid a redundant description.

The driving source 230 may include a worm gear 240 engaged with the second gear 220', and a motor 250 connected to the worm gear 240 to rotate the worm gear 240.

The second gear 220' is a two-stage gear, and a worm wheel gear 222 and a spur gear 224 may form one body.

The worm wheel gear 222 may be engaged with the worm gear 240.

The spur gear 224 may be engaged with the first gear 210.

When the motor 250 rotates the worm gear 240, the worm gear 240 may rotate the second gear 220', and the second gear 220' may rotate the first gear 210. When the first gear 210 rotates, the first gear 210 may move forward toward the holder 90 or move backward from the holder 90, and the level difference may be adjusted.

As an example of adjusting the level difference, the worker may stack the display modules 1 and then visually confirm the level difference between the display modules 1. The worker may operate a computer or an application of a terminal connected to the display device 1, and the computer or the terminal may transmit a level difference adjustment signal (e.g., a forward movement signal, a backward movement signal, etc.) to the control board of the display module 1 where the level difference occurs. The control board of the display module 1 where the level difference occurs may output a control signal to the motor 250.

Another example of adjusting the level difference may be to use a separate jig device (not illustrated) capable of measuring the level difference. After stacking the display modules 1, the worker may measure the distance between the cabinet 60 and the holder 80 by using the jig device. A value measured by the jig device may be converted into digital data and transmitted to the control board of the display module 1, and the control board of the display module 1 may output the control signal to the motor 250.

FIG. 18 is a diagram illustrating a third modification of the present embodiment.

The third modification may include a first gear 210 screwed to a cabinet 60, a second gear 220' engaged with the first gear 210, a driving source 230 that rotates the second gear 220', and a distance sensor 260 disposed in the cabinet 60.

The configurations and operations of the first gear 210, the second gear 220', and the driving source 230 in the third modification may be identical to or similar to those in the second modification, except for the distance sensor 260. Except for the distance sensor 260, the same reference numerals are used and detailed descriptions thereof are omitted.

The distance sensor 260 detects the distance between the cabinet 60 and the holder 80 or the displacement of the holder 80, and may be, for example, a laser sensor or an ultrasonic sensor.

A value measured by the distance sensor 260 may be transmitted to the control board of the display module 1, and the control board may output a control signal to the motor 250 when the measured value is out of a set range.

The above description is merely illustrative of the technical spirit of the present invention, and various modifications and changes can be made by those of ordinary skill in the art, without departing from the scope of the present invention.

Therefore, the embodiments disclosed in the present invention are not intended to limit the technical spirit of the present invention, but are intended to explain the technical spirit of the present invention. The scope of the technical spirit of the present invention is not limited by these embodiments.

The scope of the present invention should be interpreted by the appended claims, and all technical ideas within the scope equivalent thereto should be construed as falling within the scope of the present invention.

The invention claimed is:

1. A display device comprising:

a lower frame extending in a horizontal direction;

a plurality of lower guides movably disposed in the horizontal direction relative to the lower frame;

an upper frame spaced apart from the lower frame in a vertical direction and extending in the horizontal direction;

a plurality of upper guides movably disposed in the horizontal direction relative to the upper frame;

a plurality of display modules disposed between the plurality of lower guides and the plurality of upper guides in the vertical direction and the horizontal direction; and a vertical rod extending from a first lower guide of the plurality of lower guides to a first upper guide of the plurality of upper guides, wherein a lowermost display module among the plurality of display modules is connected to one of the plurality of lower guides, wherein an uppermost display module among the plurality of display modules is connected to one of the plurality of upper guides, wherein the lower frame and the upper frame extend in the horizontal direction completely across at least two display modules, wherein the vertical rod is configured to move a distance less than a width of a display module of the plurality of display modules in the horizontal direction relative to the lower frame and the upper frame while connected to both of the lower frame and the upper frame, and wherein each of the plurality of display modules is independently fixed to the vertical rod.

2. A display device comprising:

a lower frame extending in a horizontal direction;

a plurality of lower guides movably disposed in the horizontal direction relative to the lower frame;

an upper frame spaced apart from the lower frame in a vertical direction and extending in the horizontal direction;

a plurality of upper guides movably disposed in the horizontal direction relative to the upper frame;

a plurality of display modules disposed between the plurality of lower guides and the plurality of upper guides in the vertical direction and the horizontal direction; and a vertical rod extending from a first lower guide of the plurality of lower guides to a first upper guide of the plurality of upper guides, wherein a lowermost display module among the plurality of display modules is connected to one of the plurality of lower guides, wherein an uppermost display module among the plurality of display modules is connected to one of the plurality of upper guides, wherein the lower frame and the upper frame extend in the horizontal direction completely across at least two display modules, wherein the vertical rod is configured to move in the horizontal direction relative to the lower frame and the upper frame while connected to both of the lower frame and the upper frame, and wherein each of the plurality of display modules is independently fixed to the vertical rod.

3. The display device of claim 2, further comprising:

at least one lower roller disposed on the first lower guide and rolling along the lower frame; and at least one upper roller disposed on the first upper guide and rolling along the upper frame.

4. The display device of claim 2, wherein a fixing pin fixing the lowermost display module is disposed in the first lower guide.

5. The display device of claim 2, further comprising:

a supporter guide disposed on the first lower guide in the vertical direction; and a supporter on which the lowermost display module is seated and which moves upward or downward along the supporter guide.

6. The display device of claim 2, wherein each of the plurality of display modules comprises:

a cabinet;

a magnet disposed on a front surface of the cabinet;

a holder disposed in front of the cabinet;

a display panel disposed on a front surface of the holder; and an adjusting screw screwed to the holder and magnetically detachable from the magnet.

7. The display device of claim 6, further comprising:

at least one wing movably disposed in the cabinet; and a spring disposed in the cabinet to elastically support the at least one wing.

8. The display device of claim 6, wherein the adjusting screw comprises a head portion and a threaded portion protruding from the head portion, wherein the threaded portion comprises a non-threaded area in which a male screw is not formed and a threaded area in which a male screw is formed, wherein the head portion, the non-threaded area, and the threaded area are sequentially located in a longitudinal direction of the adjusting screw, and wherein the holder has a fastening hole formed with a female screw to which the male screw is screwed.

9. The display device of claim 8, wherein an accommodating hole accommodating the threaded area is formed in the holder, and wherein when the head portion is rotated, the male screw is screwed to the female screw.

10. The display device of claim 6, wherein an adjusting hole opened toward adjusting screw is formed in at least one of the cabinet or the holder.

11. The display device of claim 6, wherein each display module comprises:

a first gear screwed to the cabinet and coupled to the magnet; and a second gear engaged with the first gear.

12. The display device of claim 11, wherein each display module further comprises a driving source configured to rotate the second gear, and wherein the driving source comprises a motor.

13. The display device of claim 12, wherein each display module further comprises a distance sensor disposed in the cabinet, and wherein the motor is controlled when a value measured by the distance sensor is out of a set range.

14. The display device of claim 2, wherein each display module of the plurality of display modules is configured to be fixed to the vertical rod independently of other display modules.

15. The display device of claim 2, wherein each display module comprises a display module locker configured to lock or unlock the display module from the vertical rod.

16. The display device of claim 15, wherein the display module locker comprises:

a friction member hinged to the vertical rod and having a friction portion capable of rubbing against the vertical rod; and a wire connected to the friction member.

17. The display device of claim 16, further comprising a second friction member hinged to the vertical rod and configured to rotate toward or away from the friction member in response to rotation of a control lever module.

* * * * *